US010823620B2

(12) United States Patent
Otake

(10) Patent No.: US 10,823,620 B2
(45) Date of Patent: Nov. 3, 2020

(54) INFRARED DETECTION ELEMENT AND INFRARED DETECTION DEVICE

(71) Applicant: Murata Manufacturing Co., Ltd., Nagaokakyo (JP)

(72) Inventor: Tomonori Otake, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 55 days.

(21) Appl. No.: 16/205,261

(22) Filed: Nov. 30, 2018

(65) Prior Publication Data

US 2019/0101450 A1  Apr. 4, 2019

Related U.S. Application Data

(63) Continuation of application No. PCT/JP2017/021251, filed on Jun. 8, 2017.

(30) Foreign Application Priority Data

Jun. 23, 2016 (JP) .................................. 2016-124260

(51) Int. Cl.
*G01J 5/34* (2006.01)
*H01L 37/02* (2006.01)
*G01J 1/02* (2006.01)

(52) U.S. Cl.
CPC . *G01J 5/34* (2013.01); *G01J 1/02* (2013.01); *H01L 37/02* (2013.01)

(58) Field of Classification Search
None
See application file for complete search history.

(56) References Cited

U.S. PATENT DOCUMENTS

| 4,800,278 A | 1/1989 | Taniguti et al. |
| 5,528,038 A | 6/1996 | Yoshiike et al. |
| 8,766,187 B2 | 7/2014 | Fujiwara |
| 2013/0144563 A1 | 6/2013 | Naumann et al. |

(Continued)

FOREIGN PATENT DOCUMENTS

| JP | 62-276422 A | 12/1987 |
| JP | 05-3346 A | 1/1993 |

(Continued)

OTHER PUBLICATIONS

Official Communication issued in European Patent Application No. 17815187.4, dated Jan. 21, 2020.

(Continued)

*Primary Examiner* — Edwin C Gunberg
(74) *Attorney, Agent, or Firm* — Keating & Bennett, LLP

(57) ABSTRACT

An infrared detection element includes a pyroelectric body, first and second light receiving electrodes, and blackened films. The first light receiving electrode is provided on a surface of the pyroelectric body and receives infrared light from a first region. The second light receiving electrode is provided on a surface of the pyroelectric body and receives infrared light from a second region. The blackened films are provided on a surface of the first light receiving electrode and are not provided on a surface of the light second receiving electrode. Thus, infrared reception sensitivity is different between the first light receiving electrode and the second light receiving electrode.

20 Claims, 5 Drawing Sheets

(56) References Cited

U.S. PATENT DOCUMENTS

2015/0053859 A1    2/2015   Saito
2015/0369668 A1   12/2015   Watabe et al.

FOREIGN PATENT DOCUMENTS

| JP | 05-164608 A | 6/1993 | | |
|----|---|---|---|---|
| JP | 08-178748 A | 7/1996 | | |
| JP | 08-184493 A | 7/1996 | | |
| JP | 10-62243 A | 3/1998 | | |
| JP | 2000-292551 A | 10/2000 | | |
| JP | 2012-177680 A | 9/2012 | | |
| JP | 2013-524177 A | 6/2013 | | |
| JP | 2013-195148 | * | 9/2013 | ............... G01J 1/02 |
| JP | 2013-195148 A | 9/2013 | | |
| WO | 2012/056943 A1 | 5/2012 | | |

OTHER PUBLICATIONS

Official Communication issued in International Patent Application No. PCT/JP2017/021251, dated Aug. 1, 2017.

\* cited by examiner

INFRARED DETECTION ELEMENT AND INFRARED DETECTION DEVICE

CROSS REFERENCE TO RELATED APPLICATIONS

This application claims the benefit of priority to Japanese Patent Application No. 2016-124260 filed on Jun. 23, 2016 and is a Continuation Application of PCT Application No. PCT/JP2017/021251 filed on Jun. 8, 2017. The entire contents of each application are hereby incorporated herein by reference.

BACKGROUND OF THE INVENTION

1. Field of the Invention

The present invention relates to a pyroelectric infrared detection element in which a light receiving electrode is provided on a pyroelectric body.

2. Description of the Related Art

Japanese Unexamined Patent Application Publication No. 2000-292551 discloses a dual twin pyroelectric infrared detection element. The pyroelectric infrared detection element disclosed in Japanese Unexamined Patent Application Publication No. 2000-292551 includes two H-shaped light receiving electrodes. The two light receiving electrodes are connected to separate detection circuits in a one-to-one relationship. The two light receiving electrodes have different infrared detection-target regions. More specifically, a detection-target region of a first light receiving electrode is a region where infrared light from a small animal, such as a dog, or a moving heat-source body (such as a self-propelled cleaner) is not detected, and where infrared light from a human being is able to be detected. A detection-target region of a second light receiving electrode is a region where the infrared light mainly from the small animal or the moving heat-source body is able to be detected.

In the pyroelectric infrared detection element disclosed in Japanese Unexamined Patent Application Publication No. 2000-292551, detection of the human being and detection of the small animal are discriminated by separately using outputs of two detection circuits.

However, the pyroelectric infrared detection element disclosed in Japanese Unexamined Patent Application Publication No. 2000-292551 is required to include the detection circuit for each of the light receiving electrodes. Thus, the pyroelectric infrared detection has a complicated structure and a larger-sized shape.

SUMMARY OF THE INVENTION

Preferred embodiments of the present invention provide pyroelectric infrared detection elements each having a small size and being able to reliably detect a plurality of types of detection targets.

An infrared detection element according to a preferred embodiment of the present invention includes a pyroelectric body, a first light receiving electrode, a second light receiving electrode, and a light-sensitivity adjustment member. The first light receiving electrode is provided on a surface of the pyroelectric body and receives infrared light from a first region. The second light receiving electrode is provided on a surface of the pyroelectric body and receives infrared light from a second region. The light-sensitivity adjustment member makes infrared reception sensitivity different between the first light receiving electrode and the second light receiving electrode.

With the above-described features, infrared detection sensitivity for the first region and infrared detection sensitivity for the second region are different from each other.

In an infrared detection element according to a preferred embodiment of the present invention, preferably, the light-sensitivity adjustment member is an infrared absorption film disposed only on a surface of the first light receiving electrode.

With the above-described feature, the difference between the infrared detection sensitivity for the first region and the infrared detection sensitivity for the second region is increased.

An infrared detection element according to a preferred embodiment of the present invention may be structured as follows. The light-sensitivity adjustment member includes a first infrared absorption film disposed on a surface of the first light receiving electrode, and a second infrared absorption film disposed on a surface of the second light receiving electrode. The first infrared absorption film has a higher infrared absorbance than the second infrared absorption film.

With the above-described features, the difference between the infrared detection sensitivity for the first region and the infrared detection sensitivity for the second region is adjusted depending on the difference in infrared absorbance.

In an infrared detection element according to a preferred embodiment of the present invention, a coverage of the first infrared absorption film with respect to the first light receiving electrode may be higher than a coverage of the second infrared absorption film with respect to the second light receiving electrode.

With the above-described feature, the difference between the infrared detection sensitivity for the first region and the infrared detection sensitivity for the second region is adjusted depending on the coverage.

In an infrared detection element according to a preferred embodiment of the present invention, the first light receiving electrode has a higher infrared absorbance than the second light receiving electrode.

With the above-described feature, the difference in infrared absorbance is obtained depending on electrode materials.

An infrared detection element according to a preferred embodiment of the present invention may be structured as follows. A thickness of the pyroelectric body is different between a first region in which the first light receiving electrode is provided and a second region in which the second light receiving electrode is provided. The pyroelectric body in the first region has a smaller thickness than that of the pyroelectric body in the second region.

With the above-described features, the difference in sensitivity for the infrared light between detection signals is obtained depending on the structure of the pyroelectric body.

An infrared detection device according to a preferred embodiment of the present invention includes a first element, a second element, a connection portion, an impedance converter, and a determiner. The first element includes a first light receiving electrode and a pyroelectric body. The second element includes a second light receiving electrode and a pyroelectric body. The connection portion interconnects the first element and the second element. The impedance converter generates detection signals from electric charges in the first element and the second element through the connection portion. The determiner determines detection of infrared light on the basis of the detection signals.

With the above-described features, detection of the infrared light from the first region and detection of the infrared light from the second region are achieved with one impedance converter and one determiner.

According to preferred embodiments of the present invention, pyroelectric infrared detection elements capable of reliably detecting a plurality of types of detection targets are able to be obtained with a small size.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Infrared detection elements and infrared detection devices according to preferred embodiments of the present invention will be described below with reference to the drawings.

Figure 1A:
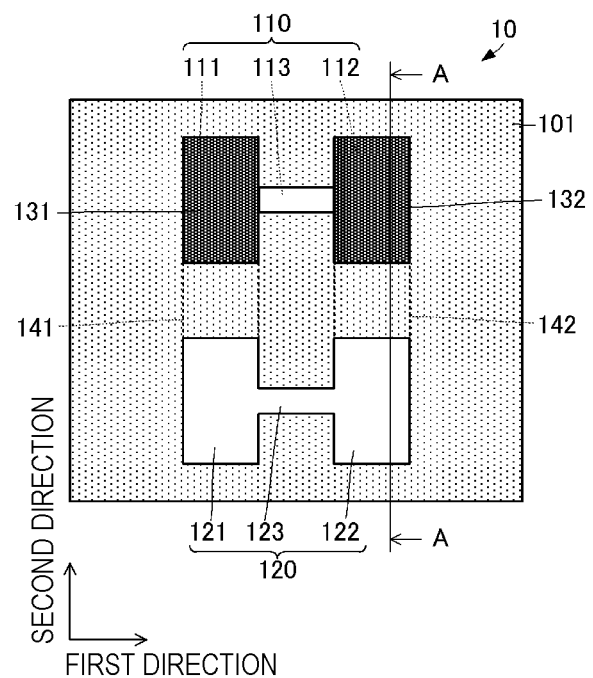
FIG. 1A is a plan view of an infrared detection element according to a first preferred embodiment of the present invention.
Figure 1B:
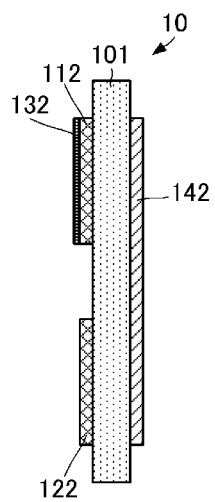
FIG. 1B is a sectional view taken along A-A in FIG. 1A.

An infrared detection element and an infrared detection device according to a first preferred embodiment of the present invention will be described below. FIG. 1A is a plan view of the infrared detection element according to the first preferred embodiment of the present invention. FIG. 1B is a sectional view taken along A-A in FIG. 1A.

As illustrated in FIGS. 1A and 1B, the infrared detection element 10 includes a pyroelectric body 101, a light receiving electrode 110, a light receiving electrode 120, a blackened film 131, a blackened film 132, and connection electrodes 141 and 142. The light receiving electrode 110 corresponds to a "first light receiving electrode", and the light receiving electrode 120 corresponds to a "second light receiving electrode". The blackened film 131 corresponds to a "first blackened film", and the blackened film 132 corresponds to a "second blackened film".

The pyroelectric body 101 is made of a material that generates a pyroelectric effect. The pyroelectric body 101 is preferably made of, for example, a ferroelectric material. The pyroelectric body 101 has a flat plate shape.

The light receiving electrode 110 and the light receiving electrode 120 are provided on a front surface of the pyroelectric body 101.

The light receiving electrode 110 includes detection electrodes 111 and 112, and a wiring electrode 113. The detection electrodes 111 and 112 are preferably each rectangular or substantially rectangular when viewed in plan view. The detection electrodes 111 and 112 are spaced apart from each other along a first direction. The wiring electrode 113 is a linear electrode extending along the first direction. The wiring electrode 113 interconnects the detection electrode 111 and the detection electrode 112. A length of the wiring electrode 113 along a second direction is shorter than that of the detection electrode 111 along the second direction and that of the detection electrode 112 along the second direction. Thus, the light receiving electrode 110 is an H-shaped electrode when viewed in plan. The detection electrode 111 and the detection electrode 112 preferably have the same or substantially the same shape. With the detection electrode 111 and the detection electrode 112 having the same or substantially the same shape, infrared detection accuracy is improved because both of the detection electrodes are balanced with each other and stabilized with respect to variations of outside air temperature.

The light receiving electrode 120 includes detection electrodes 121 and 122, and a wiring electrode 123. The detection electrodes 121 and 122 are preferably each rectangular or substantially rectangular when viewed in plan. The detection electrodes 121 and 122 are spaced apart from one another along the first direction. The wiring electrode 123 is a linear electrode extending along the first direction. The wiring electrode 123 interconnects the detection electrode 121 and the detection electrode 122. A length of the wiring electrode 123 along the second direction is shorter than that of the detection electrode 121 along the second direction and that of the detection electrode 122 along the second direction. Thus, the light receiving electrode 120 is an H-shaped electrode when viewed in plan. The detection electrode 121 and the detection electrode 122 preferably have the same or substantially the same shape. With the detection electrode 121 and the detection electrode 122 having the same or substantially the same shape, infrared detection accuracy is improved.

The light receiving electrode 110 and the light receiving electrode 120 are disposed side by side in the second direction. The light receiving electrode 110 and the light receiving electrode 120 are spaced apart from each other.

The blackened film 131 is provided over an entire or substantially an entire surface of the detection electrode 111 in the light receiving electrode 110. The blackened film 132 is provided over an entire or substantially an entire surface of the detection electrode 112 in the light receiving electrode 110. In other words, the blackened films 131 and 132 are provided only on the surfaces of the detection electrodes 111 and 112 in the light receiving electrode 110. The blackened films 131 and 132 correspond to "infrared absorption films".

With the above-described structure, infrared reception sensitivity of the light receiving electrode 110 becomes higher than that of the light receiving electrode 120. Each of the blackened films 131 and 132 corresponds to a "light-sensitivity adjustment member".

Thus, detection sensitivity for infrared light detected by the light receiving electrode 110 becomes higher than that for infrared light detected by the light receiving electrode 120. Accordingly, infrared detection sensitivity in a first infrared-detection target region (corresponding to a "first region") assigned to the light receiving electrode 110 is different from that in a second infrared-detection target region (corresponding to a "second region") assigned to the light receiving electrode 120. The infrared detection element 10 as described above enables detection of infrared light to be performed for a plurality of regions providing different detection sensitivities with a simple structure. As a result, a size of the infrared detection element 10 is able to be reduced.

The connection electrodes 141 and 142 are provided on a rear surface of the pyroelectric body 101. The connection electrode 141 is opposed to the detection electrode 111 in the light receiving electrode 110 and the detection electrode 121 in the light receiving electrode 120 with the pyroelectric body 101 interposed therebetween. The connection electrode 142 is opposed to the detection electrode 112 in the light receiving electrode 110 and the detection electrode 122 in the light receiving electrode 120 with the pyroelectric body 101 interposed therebetween.

Figure 2:
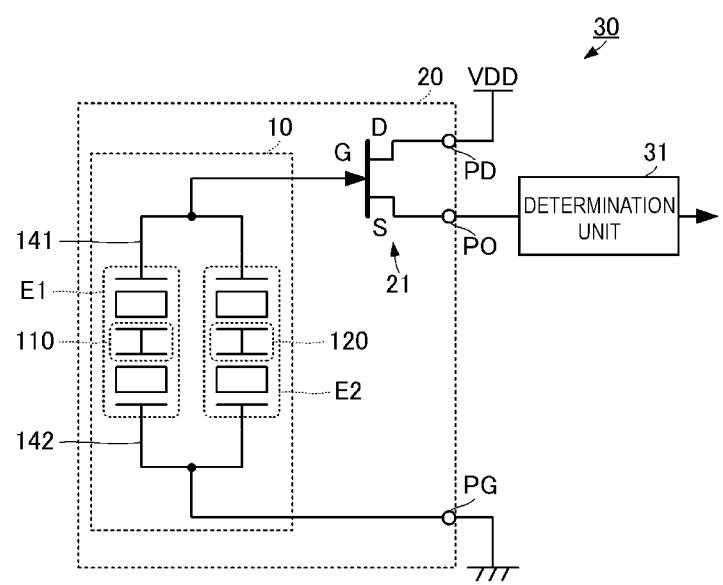
FIG. 2 is a circuit diagram of an infrared detection device according to the first preferred embodiment of the present invention.

The infrared detection element 10 as described above is used in an infrared detection device illustrated in FIG. 2. FIG. 2 is a circuit diagram of the infrared detection device according to the first preferred embodiment of the present invention.

As illustrated in FIG. 2, the infrared detection device includes an infrared detection element 10, an impedance converter 21, and a determiner 31. The infrared detection element 10 and the impedance converter 21 define an infrared sensor 20. The infrared sensor 20 includes a ground terminal PG, a drive-voltage input terminal PD, and an output terminal PO.

The infrared detection element 10 has the above-described structure illustrated in FIGS. 1A and 1B. The infrared detection element 10 includes a first element E1 including the light receiving electrode 110 and the pyroelectric body 101, and a second element E2 including the light receiving electrode 120 and the pyroelectric body 101. The first element E1 and the second element E2 are connected in parallel by the connection electrode 141 and the connection electrode 142.

The infrared detection element 10 is connected to the impedance converter 21 through the connection electrode 141. The connection electrode 141 corresponds to a "connection portion". The infrared detection element 10 is connected to the ground terminal PG through the connection electrode 142. The ground terminal PG is grounded.

The impedance converter 21 is preferably defined by an n-type FET, for example. A gate G of the n-type FET is connected to the connection electrode 141. A drain of the n-type FET is connected to the drive-voltage input terminal PD. A source of the n-type FET is connected to the output terminal PO.

The determiner 31 is preferably defined by a microcomputer, for example. The determiner 31 is connected to the output terminal PO of the infrared sensor 20.

When the infrared detection element 10 detects infrared light, a voltage depending on generated electric charges is applied to the gate of the n-type FET defining the impedance converter 21. A drive voltage VDD is applied to the impedance converter 21 via the drive-voltage input terminal PD. The impedance converter 21 outputs a source voltage having a magnitude depending on the gate voltage. This source voltage signal corresponds to a "detection signal".

The determiner 31 executes detection of the infrared light based on the magnitude of the source voltage signal.

In the infrared detection element 10, infrared detection sensitivity is different between the first element E1 including the light receiving electrode 110 and the second element E2 including the light receiving electrode 120. Accordingly, electric charges generated when detecting the infrared light are different between the first infrared-detection target region, i.e., a detection target of the first element E1, and the second infrared-detection target region, i.e., a detection target of the second element E2. Thus, the magnitude (amplitude) of the detection signal output from the impedance converter 21 is also different therebetween.

By detecting the magnitude of the detection signal, the determiner 31 is able to easily determine in which one of the first infrared-detection target region and the second infrared-detection target region the infrared light has been detected.

Furthermore, the determiner 31 previously stores a threshold for the magnitude of the detection signal, and compares the detection signal with the threshold. Depending on a comparison result, if the magnitude of the detection signal is not smaller than the threshold, the determiner 31 determines that the infrared light has been detected. Thus, the infrared detection device 30 is able to obtain the detection of the infrared light in a manner of restricting (or exclusively aiming at) the detection target.

Figure 3:
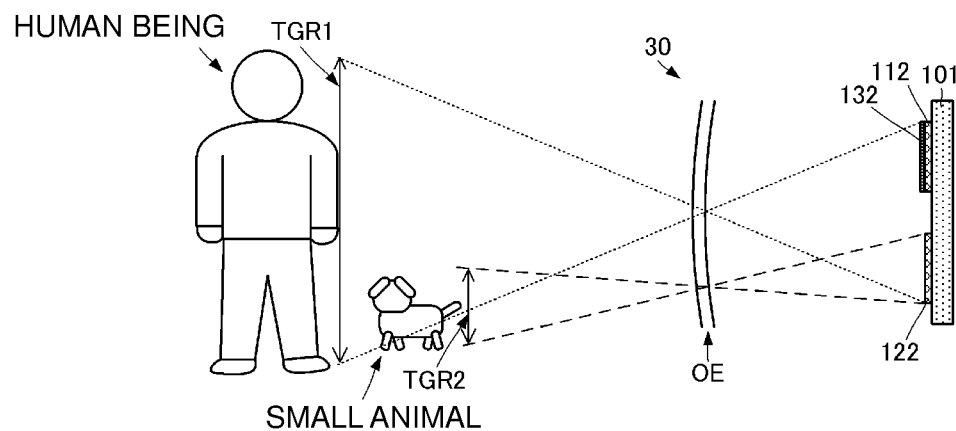
FIG. 3 illustrates an application example of the infrared detection device according to a preferred embodiment of the present invention.

FIG. 3 illustrates an application example of the infrared detection device according to a preferred embodiment of the present invention. In the example of FIG. 3, the infrared detection device 30 includes an optical element OE. In the infrared detection device, the first infrared-detection target region TGR1 is set as a region targeting a human being, but not targeting a small animal, such as a dog, or a moving low-height heat source body. The second infrared-detection target region TGR2 is set to mainly target the small animal, such as the dog, or the moving low-height heat source body, and to allow a portion of the human being to be included therein.

With the above-described setting, in the infrared detection element 10 and the infrared detection device 30, the detection sensitivity is able to be increased for the region targeting the human being, but not targeting the small animal, and is able to be reduced for the region targeting the small animal. Accordingly, the infrared detection element 10 and the infrared detection device 30, each reliably detecting the human being and reliably not detecting the small animal, is able to be obtained. Moreover, the infrared detection device 30 is not required to include the detection circuit for each element, i.e., for each detection-target region. As a result, the infrared detection device 30 has a small size and a simple structure.

Figure 4:
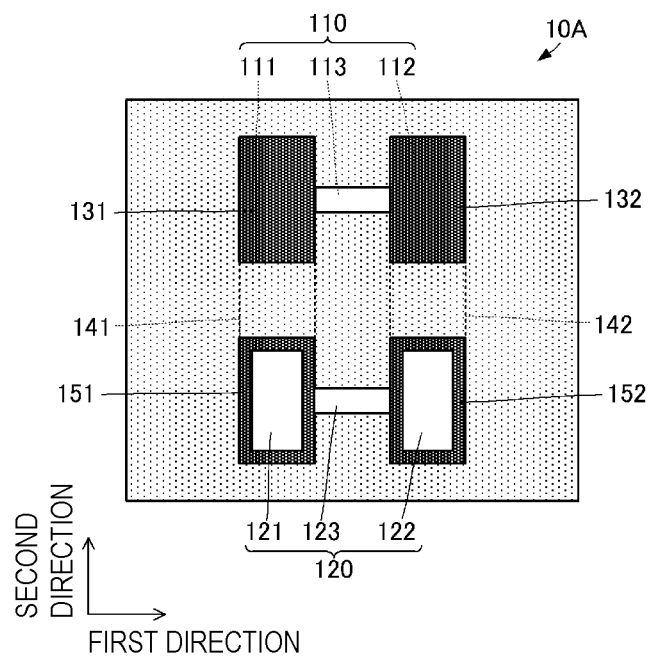
FIG. 4 is a plan view illustrating an infrared detection element according to a second preferred embodiment of the present invention.

An infrared detection element according to a second preferred embodiment of the present invention will be described below. FIG. 4 is a plan view illustrating the infrared detection element according to the second preferred embodiment.

As illustrated in FIG. 4, the infrared detection element 10A according to the second preferred embodiment is different from the infrared detection element 10 according to the first preferred embodiment in the addition of blackened films 151 and 152. Other elements of the infrared detection element 10A are the same as or similar to those of the infrared detection element 10, and description of the same elements is omitted.

The infrared detection element 10A includes the blackened films 151 and 152. Each of the blackened films 151 and 152 corresponds to the "light-sensitivity adjustment member". The blackened film 151 is provided on a surface of the detection electrode 121 in the light receiving electrode 120. The blackened film 151 covers a portion of the detection electrode 121. More specifically, the blackened film 151 is provided along sides of the detection electrode 121. The blackened film 151 is not provided in a central region of the detection electrode 121. The blackened film 152 is provided on a surface of the detection electrode 122 in the light receiving electrode 120. The blackened film 152 covers a portion of the detection electrode 122. More specifically, the blackened film 152 is provided along sides of the detection electrode 122. The blackened film 152 is not provided in a central region of the detection electrode 122.

With the above-described structure, a coverage of the blackened films 131 and 132 with respect to the surface of the light receiving electrode 110 is able to be made different from that of the blackened films 151 and 152 with respect to the surface of the light receiving electrode 120. Accordingly, the light sensitivity of the light receiving electrode 110 is able to be made different from that of the light receiving electrode 120. Furthermore, with the above-described structure, the sensitivity difference between the light sensitivity of the light receiving electrode 110 and the light sensitivity of the light receiving electrode 120 is able to be adjusted by adjusting the coverage of the blackened films 151 and 152 with respect to the surface of the light receiving electrode 120.

Figure 5:
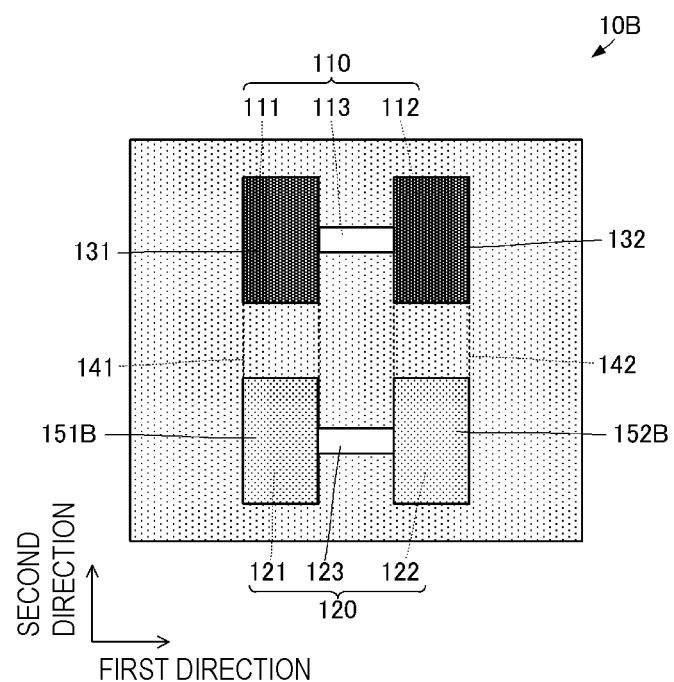
FIG. 5 is a plan view illustrating an infrared detection element according to a third preferred embodiment of the present invention.

An infrared detection element according to a third preferred embodiment of the present invention will be described below. FIG. 5 is a plan view illustrating the infrared detection element according to the third preferred embodiment.

As illustrated in FIG. 5, the infrared detection element 10B according to the third preferred embodiment is different from the infrared detection element 10 according to the first preferred embodiment in the addition of blackened films 151B and 152B. Other elements of the infrared detection element 10B are the same as or similar to those of the infrared detection element 10, and description of the same elements is omitted.

The infrared detection element 10B includes the blackened films 151B and 152B. Each of the blackened films 151B and 152B corresponds to the "light-sensitivity adjustment member". The blackened film 151B is provided over the entire or substantially the entire surface of the detection electrode 121 in the light receiving electrode 120. The blackened film 152B is provided over the entire or substantially the entire surface of the detection electrode 122 in the light receiving electrode 120.

An infrared absorbance of the blackened films 151B and 152B is lower than that of the blackened films 131 and 132.

Also with the above-described structure, the light sensitivity of the light receiving electrode 110 is able to be made different from that of the light receiving electrode 120. Furthermore, with the above-described structure, the difference between the light sensitivity of the light receiving electrode 110 and the light sensitivity of the light receiving electrode 120 is able to be adjusted by adjusting the difference between the infrared absorbance of the blackened films 131 and 132 and the infrared absorbance of the blackened films 151B and 152B.

Figure 6:
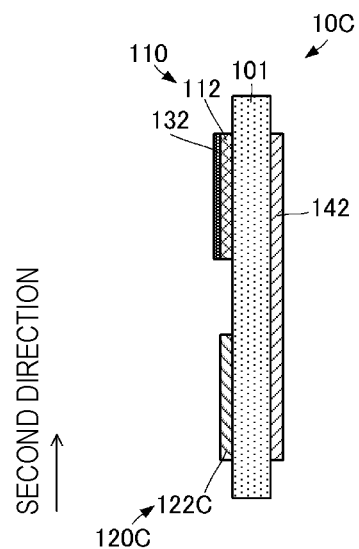
FIG. 6 is a side sectional view illustrating an infrared detection element according to a fourth preferred embodiment of the present invention.

An infrared detection element according to a fourth preferred embodiment of the present invention will be described below. FIG. 6 is a side sectional view illustrating the infrared detection element according to the fourth preferred embodiment.

As illustrated in FIG. 6, the infrared detection element 10C according to the fourth preferred embodiment is different from the infrared detection element 10 according to the first preferred embodiment in including a light receiving electrode 120C, instead of the light receiving electrode 120. Other elements of the infrared detection element 10C are the same as or similar to those of the infrared detection element 10, and description of the same elements is omitted.

The infrared detection element 10C includes the light receiving electrode 120C. The light receiving electrode 120C has the same or substantially the same shape as the light receiving electrode 120 in the first preferred embodiment. An infrared absorbance of the light receiving electrode 120C (i.e., the electrode including the detection electrode 122C in FIG. 6) is lower than that of the light receiving electrode 110 (i.e., the electrode including the detection electrode 112 in FIG. 6).

Also with the above-described structure, the light sensitivity of the light receiving electrode 110 is able to be made different from that of the light receiving electrode 120C. Furthermore, with the above-described structure of the infrared detection element 10C, the difference in infrared detection sensitivity between the first element E1 and the second element E2 is able to be further increased due to the synergetic effect of both of the difference in light sensitivity between the light receiving electrode 110 and the light receiving electrode 120, which is caused by the presence of the blackened films 131 and 132, and the difference in light sensitivity between the light receiving electrode 110 and the light receiving electrode 120C, which is caused by materials of the light receiving electrode 110 and the light receiving electrode 120C.

Moreover, with the above-described structure, the sensitivity difference between the light sensitivity of the light receiving electrode 110 and the light sensitivity of the light receiving electrode 120C is able to be adjusted by adjusting the difference between the infrared absorbance of the light receiving electrode 110 and the infrared absorbance of the light receiving electrode 120C.

Figure 7:
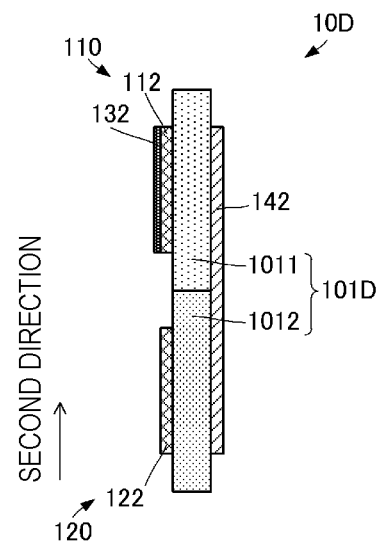
FIG. 7 is a side sectional view illustrating an infrared detection element according to a fifth preferred embodiment of the present invention.

An infrared detection element according to a fifth preferred embodiment of the present invention will be described below. FIG. 7 is a side sectional view illustrating the infrared detection element according to the fifth preferred embodiment.

As illustrated in FIG. 7, the infrared detection element 10D according to the fifth preferred embodiment is different from the infrared detection element 10 according to the first preferred embodiment in the structure of a pyroelectric body 101D. Other elements of the infrared detection element 10D are the same as or similar to those of the infrared detection element 10 according to the first preferred embodiment, and description of the same elements is omitted.

The infrared detection element 10D includes the pyroelectric body 101D. The pyroelectric body 101D includes a first region 1011 and a second region 1012. The first region 1011 and the second region 1012 are arrayed side by side in the second direction. A polarizability of the first region 1011 is higher than that of the second region 1012. The light receiving electrode 110 is provided on a surface of the first region 1011. The light receiving electrode 120 is provided on a surface of the second region 1012.

With the above-described structure, the difference in infrared detection sensitivity between the first element E1 and the second element E2 is able to be increased. Moreover, with the infrared detection element 10D, the difference in infrared detection sensitivity between the first element E1 and the second element E2 is able to be further increased due to the synergetic effect of both of the difference in light sensitivity between the light receiving electrode 110 and the light receiving electrode 120, which is caused by the presence of the blackened films 131 and 132, and the difference in polarizability between the first region 1011 and the second region 1012 of the pyroelectric body 101D.

Figure 8:
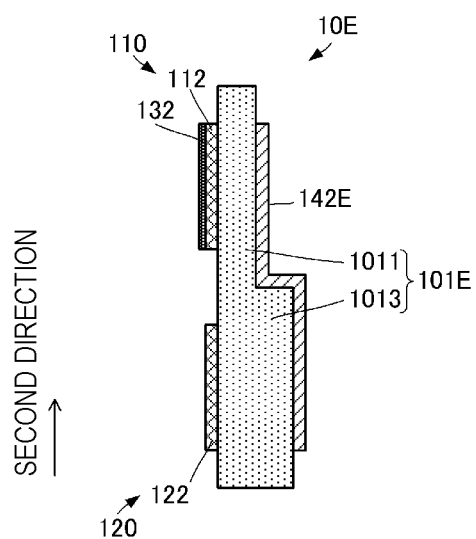
FIG. 8 is a side sectional view illustrating an infrared detection element according to a sixth preferred embodiment of the present invention.

An infrared detection element according to a sixth preferred embodiment of the present invention will be described below. FIG. 8 is a side sectional view illustrating the infrared detection element according to the sixth preferred embodiment.

As illustrated in FIG. 8, the infrared detection element 10E according to the sixth preferred embodiment is different from the infrared detection element 10 according to the first preferred embodiment in the structure of a pyroelectric body 101E. Other elements of the infrared detection element 10E are the same as or similar to those of the infrared detection element 10 according to the first preferred embodiment, and description of the same elements is omitted.

The infrared detection element 10E includes the pyroelectric body 101E. The pyroelectric body 101E includes a first region 1011 and a second region 1013. The first region 1011 and the second region 1013 are arrayed side by side in the second direction. A thickness of the first region 1011 is smaller than that of the second region 1013. The light receiving electrode 110 is provided on a surface of the first region 1011. The light receiving electrode 120 is provided on a surface of the second region 1013. Because of the above-described structure, a capacitance produced in the first region 1011 between the light receiving electrode 110 and each of the connection electrodes 141 and 142 is greater than that produced in the second region 1013 between the light receiving electrode 120 and each of the connection electrodes 141 and 142.

With the above-described structure, the difference in infrared detection sensitivity between the first element E1 and the second element E2 is able to be increased. Moreover, with the structure of the infrared detection element 10E, the difference in infrared detection sensitivity between the first element E1 and the second element E2 is able to be further increased due to the synergetic effect of both of the difference in light sensitivity between the light receiving electrode 110 and the light receiving electrode 120, which is caused by the presence of the blackened films 131 and 132, and the difference in thickness between the first region 1011 and the second region 1013 of the pyroelectric body 101E.

The structure of the above-described preferred embodiments may be combined with each other as appropriate. Various advantageous effects are able to be obtained depending on the combinations of the structure.

Figure 9:
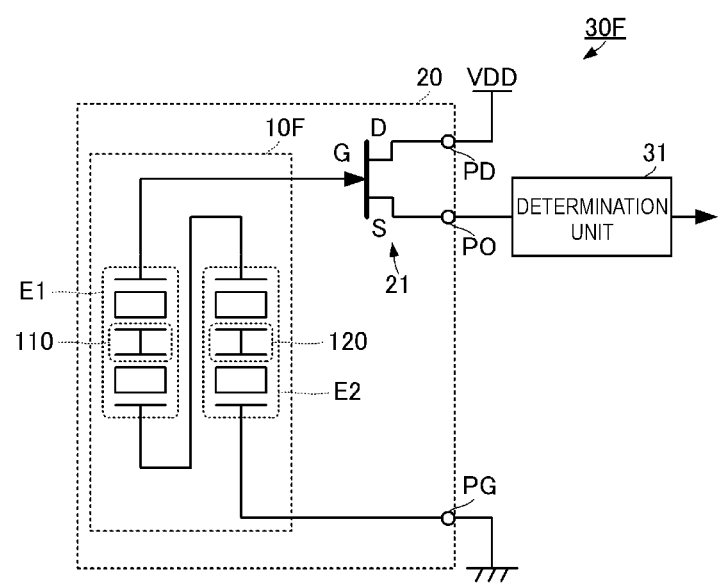
FIG. 9 is a circuit diagram of an infrared detection device in another configuration according to a preferred embodiment of the present invention.

The first preferred embodiment illustrates the structure in which the first element E1 and the second element E2 are connected in parallel. However, the structure may be modified as illustrated in FIG. 9. FIG. 9 is a circuit diagram of an infrared detection device with another structure according to a preferred embodiment of the present invention.

As illustrated in FIG. 9, in an infrared detection element 10F, the first element E1 and the second element E2 are connected in series. In an infrared detection device 30F, the serial circuit is connected between the impedance converter 21 and the ground terminal PG.

The above-described structure may also provide similar advantageous effects to those obtained with the infrared detection element 10 and the infrared detection device 30, illustrated in FIG. 2, according to the first preferred embodiment.

While the above description has been made in connection with the case in which the detection electrode has a rectangular or substantially rectangular shape, the detection electrode may have a polygonal or circular shape, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An infrared detection element comprising:
a pyroelectric body;
a first light receiving electrode on a surface of the pyroelectric body and receiving infrared light from a first region;
a second light receiving electrode on a surface of the pyroelectric body and receiving infrared light from a second region; and
a light-sensitivity adjustment member that makes infrared reception sensitivity different between the first light receiving electrode and the second light receiving electrode.

2. The infrared detection element according to claim 1, wherein the light-sensitivity adjustment member includes an infrared absorption film located only on a surface of the first light receiving electrode.

3. The infrared detection element according to claim 1, wherein
the light-sensitivity adjustment member includes a first infrared absorption film on a surface of the first light receiving electrode, and a second infrared absorption film on a surface of the second light receiving electrode; and
the first infrared absorption film has a higher infrared absorbance than the second infrared absorption film.

4. The infrared detection element according to claim 3, wherein a coverage of the first infrared absorption film with respect to the surface of the first light receiving electrode is higher than a coverage of the second infrared absorption film with respect to the surface of the second light receiving electrode.

5. The infrared detection element according to claim 1, wherein the first light receiving electrode has a higher infrared absorbance than the second light receiving electrode.

6. The infrared detection element according to claim 1, wherein
a polarizability of the pyroelectric body is different between a first region in which the first light receiving electrode is provided on the surface of the pyroelectric body and a second region in which the second light receiving electrode is provided on the surface of the pyroelectric body; and
the first region has a higher polarizability than the second region.

7. The infrared detection element according to claim 1, wherein a thickness of the pyroelectric body is different between a first region in which the first light receiving electrode is provided on the surface of the pyroelectric body and a second region in which the second light receiving electrode is provided on the surface of the pyroelectric body.

8. The infrared detection element according to claim 7, wherein the pyroelectric body in the first region has a smaller thickness than the pyroelectric body in the second region.

9. The infrared detection element according to claim 1, wherein the pyroelectric body is made of a ferroelectric material.

10. The infrared detection element according to claim 1, wherein each of the first and second light receiving electrodes is defined by an H-shaped electrode.

11. An infrared detection device comprising:
the infrared detection element according to claim 1;
a first element including the first light receiving electrode and the pyroelectric body;
a second element including the second light receiving electrode and the pyroelectric body;
a connection portion interconnecting the first element and the second element;
an impedance converter generating detection signals from electric charges in the first element and the second element through the connection portion; and
a determiner that determines detection of infrared light based on the detection signals.

12. The infrared detection device according to claim 11, wherein the light-sensitivity adjustment member includes an infrared absorption film located only on a surface of the first light receiving electrode.

13. The infrared detection device according to claim 11, wherein
the light-sensitivity adjustment member includes a first infrared absorption film on a surface of the first light receiving electrode, and a second infrared absorption film on a surface of the second light receiving electrode; and
the first infrared absorption film has a higher infrared absorbance than the second infrared absorption film.

14. The infrared detection device according to claim 13, wherein a coverage of the first infrared absorption film with respect to the surface of the first light receiving electrode is higher than a coverage of the second infrared absorption film with respect to the surface of the second light receiving electrode.

15. The infrared detection device according to claim 11, wherein the first light receiving electrode has a higher infrared absorbance than the second light receiving electrode.

16. The infrared detection device according to claim 11, wherein
a polarizability of the pyroelectric body is different between a first region in which the first light receiving electrode is provided on the surface of the pyroelectric body and a second region in which the second light receiving electrode is provided on the surface of the pyroelectric body; and
the first region has a higher polarizability than the second region.

17. The infrared detection device according to claim 11, wherein a thickness of the pyroelectric body is different between a first region in which the first light receiving electrode is provided on the surface of the pyroelectric body and a second region in which the second light receiving electrode is provided on the surface of the pyroelectric body.

18. The infrared detection device according to claim 17, wherein the pyroelectric body in the first region has a smaller thickness than the pyroelectric body in the second region.

19. The infrared detection device according to claim 11, wherein the pyroelectric body is made of a ferroelectric material.

20. The infrared detection device according to claim 11, wherein each of the first and second light receiving electrodes is defined by an H-shaped electrode.

* * * * *